United States Patent [19]
Turner et al.

[11] Patent Number: 6,134,892
[45] Date of Patent: *Oct. 24, 2000

[54] COOLED ELECTRICAL SYSTEM FOR USE DOWNHOLE

[75] Inventors: William Evans Turner, Durham; Ronald Seppa, Marlborough, both of Conn.; William Edward Turner, Hershey, Pa.; Alan J. Sallwasser, Houston, Tex.

[73] Assignee: APS Technology, Inc., Cromwell, Conn.

[*] Notice: This patent is subject to a terminal disclaimer.

[21] Appl. No.: 09/243,768

[22] Filed: Feb. 3, 1999

Related U.S. Application Data

[63] Continuation-in-part of application No. 09/064,898, Apr. 23, 1998, Pat. No. 5,931,000.

[51] Int. Cl.[7] .................................................. F25B 21/02
[52] U.S. Cl. .............................. 62/3.2; 62/3.7; 62/259.2; 166/66
[58] Field of Search ........................ 62/3.2, 3.7, 259.2; 166/66

[56] References Cited

U.S. PATENT DOCUMENTS

| | | | |
|---|---|---|---|
| 3,488,970 | 1/1970 | Hallenburg | 62/3.2 |
| 4,199,953 | 4/1980 | Richter, Jr. et al. | 62/3 |
| 4,375,157 | 3/1983 | Boesen | 62/260 |
| 4,407,136 | 10/1983 | De Kanter | 62/64 |
| 4,935,864 | 6/1990 | Schmidt et al. | 363/141 |
| 5,067,040 | 11/1991 | Fallik | 361/380 |
| 5,144,245 | 9/1992 | Wisler | 324/338 |
| 5,280,243 | 1/1994 | Miller | 324/303 |
| 5,499,258 | 3/1996 | Kawano et al. | 372/34 |
| 5,515,683 | 5/1996 | Kessler | 62/3.7 |
| 5,547,028 | 8/1996 | Owens et al. | 166/302 |
| 5,569,950 | 10/1996 | Lewis et al. | 257/467 |
| 5,572,407 | 11/1996 | Sobhani | 361/719 |
| 5,602,860 | 2/1997 | Masonson | 372/34 |
| 5,603,220 | 2/1997 | Seaman | 62/3.7 |
| 5,618,459 | 4/1997 | Kamiya | 219/497 |
| 5,637,921 | 6/1997 | Burward-Hoy | 257/712 |
| 5,640,407 | 6/1997 | Freyman et al. | 372/36 |
| 5,655,375 | 8/1997 | Ju | 62/3.6 |
| 5,816,344 | 10/1998 | Turner | 175/40 |
| 5,931,000 | 8/1999 | Turner et al. | 62/3.2 |

OTHER PUBLICATIONS

U.S. Ser. No. 09/064,898, Turner, et al., filed Apr. 23, 1998.
Furon, *Thermal Management Solutions for Microprocessors*, 1996.

*Primary Examiner*—William Doerrler
*Assistant Examiner*—Chen-Wen Jiang
*Attorney, Agent, or Firm*—Woodcock Washburn Kurtz Mackiewicz & Norris LLP

[57] ABSTRACT

A system for cooling electronic components in the downhole assembly of a drill string through which a drilling fluid flows. The cooling system includes a thermoelectric cooler that conducts heat from the electronic component to a first heat transfer surface of a thermal conductor. The heat received by the first heat transfer surface is transferred within the thermal conductor to a second heat transfer surface that then transfers the heat to a housing. The housing transfers the heat to the drilling fluid flowing over the housing. To ensure good conductive heat transfer between the electronic component, the thermoelectric cooler, the thermal conductor and the housing, and to absorb shock, vibration and differential thermal expansion, these components are supported on a spring mechanism that generates a force that biases the electronic component against the thermoelectric cooler, the thermoelectric cooler against the thermal conductor and the thermal conductor against the housing.

25 Claims, 7 Drawing Sheets

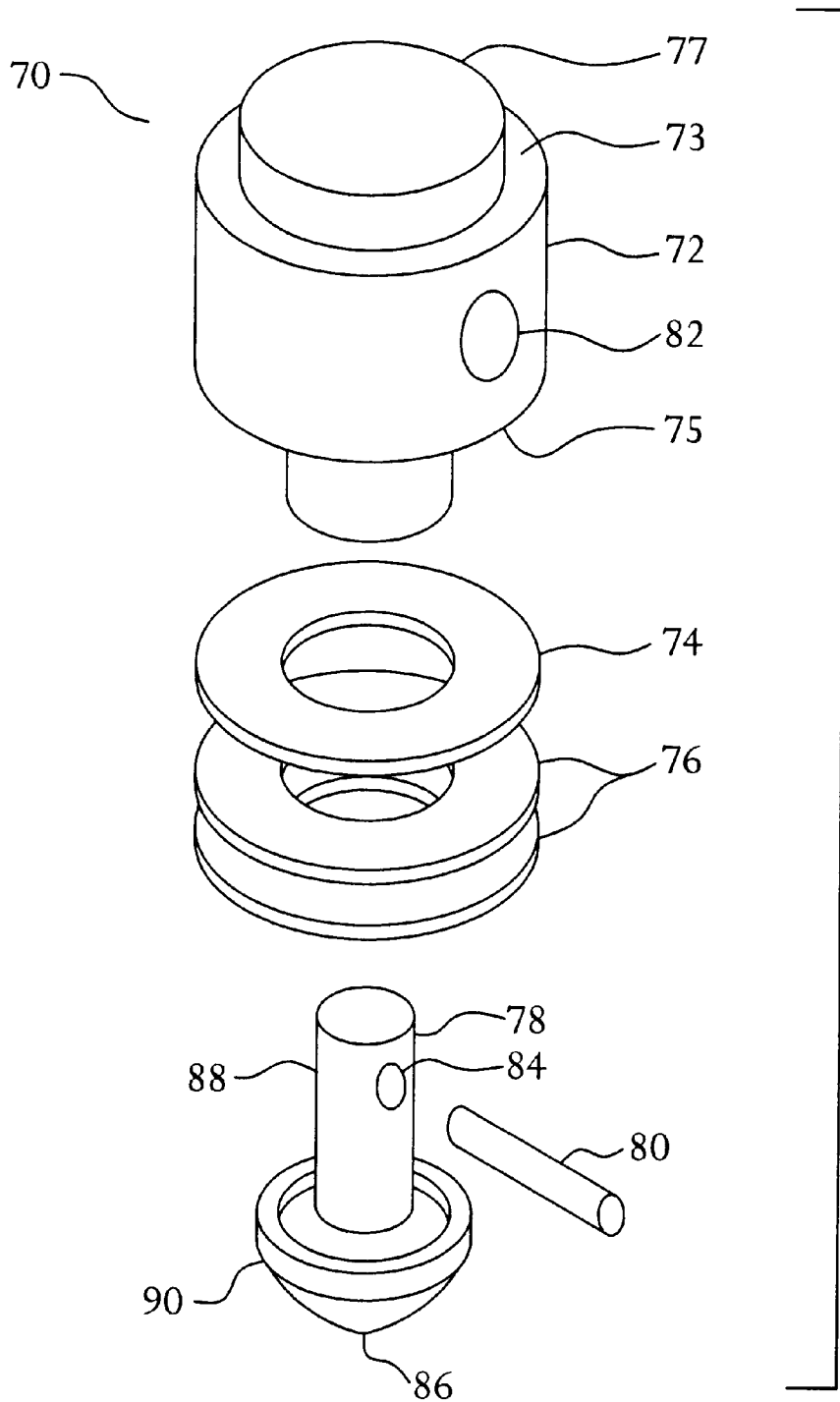

COOLED ELECTRICAL SYSTEM FOR USE DOWNHOLE

RELATED APPLICATION

This application is a continuation-in-part of U.S. application Ser. No. 09/064,898, filed Apr. 23, 1998, now U.S. Pat. No. 5,931,000, entitled "Cooled Electrical System For Use Downhole," hereby incorporated by reference herein in its entirety.

FIELD OF THE INVENTION

The current invention is directed to an apparatus for drilling or monitoring wells, such as gas, oil or geothermal wells. More specifically, the current invention is directed to a cooled electrical system used downhole.

BACKGROUND OF THE INVENTION

In underground drilling, such as gas, oil or geothermal drilling, a bore is drilled through a formation deep in the earth. Such bores are formed by connecting a drill bit to sections of long pipe, referred to as a "drill pipe," so as to form an assembly commonly referred to as a "drill string" that extends from the surface to the bottom of the bore. The drill bit is rotated, thereby causing it to advance into the earth, forming the bore. In order to lubricate the drill bit and flush cuttings from its path, a high pressure fluid, referred to as "drilling mud," is directed through an internal passage in the drill string and out through the drill bit. The drilling mud then flows to the surface through the annular passage formed between the drill string and the surface of the bore.

The distal end of a drill string, which includes the drill bit, is referred to as the "downhole assembly." In addition to the drill bit, the downhole assembly often includes specialized modules within the drill string that make up the electrical system for the drill string. Such modules may include sensing modules, a control module and a pulser module.

In some applications, the sensing modules provide the drill operator with information concerning the formation being drilled through using techniques commonly referred to as "measurement while drilling" (MWD) or "logging while drilling" (LWD). For example, resistivity sensors may be used to transmit, and then receive, high frequency wavelength signals (e.g., electromagnetic waves) that travel through the formation surrounding the sensor. The construction of one such device is shown in U.S. Pat. No. 5,816,344 (Turner), hereby incorporated by reference in its entirety. By comparing the transmitted and received signals, information can be determined concerning the nature of the formation through which the signal traveled, such as whether it contains water or hydrocarbons. One such method for sensing and evaluating the characteristics of the formation is disclosed in U.S. Pat. No. 5,144,245 (Wisler), hereby incorporated by reference in its entirety. Other sensors are used in conjunction with magnetic resonance imaging (MRI) such as that disclosed in U.S. Pat. No. 5,280,243 (Miller), hereby incorporated by reference in its entirety. Still other sensors include gamma scintillators, which are used to determine the natural radioactivity of the formation, and nuclear detectors, which are used to determine the porosity and density of the formation.

In other applications, sensing modules provide information concerning the direction of the drilling and can be used, for example, to control the direction in which the drill bit advances in a steerable drill string. Such sensors may include a magnetometer to sense azimuth and an accelerometer to sense inclination.

Signals from the sensor modules are typically received and processed in the control module, which may incorporate specialized electronic components to digitize and store the sensor data. In addition, the control module may also direct the pulser modules to generate pulses within the flow of drilling fluid that contain information derived from the sensor signals. These pressure pulses are transmitted to the surface, where they are detected and decoded, thereby providing information to the drill operator.

As can be readily appreciated, such an electrical system will include many sophisticated electronic components, such as the sensors themselves, which in some cases include or are mounted on printed circuit boards, and associated components for storing and processing data in the control module, which may also include printed circuit boards. Unfortunately, many of these electronic components generate heat. For example, the components of a typical MWD system (i.e., a magnetometer, accelerometer, solenoid driver, microprocessor, power supply and gamma scintillator) may generate over 20 watts of heat. Moreover, even if the electronic component itself does not generate heat, the temperature of the formation itself may exceed the maximum temperature capability of the components.

Over-heating can result in failure or reduced life expectancy from such electronic components. For example, photomultiplier tubes, which are used in gamma scintillators and nuclear detectors for converting light energy from a scintillating crystal into electrical current, cannot operate above 175° C. Consequently, cooling of the electronic components is important. Unfortunately, cooling is made difficult by the fact that the temperature of the formation surrounding deep wells, especially geothermal wells, is typically relatively high, and may exceed 200° C.

Certain methods have been proposed for cooling electronic components in applications associated with the monitoring and logging of existing wells, as distinguished from the drilling of new wells. One such approach, which requires isolating the electronic components from the formation by incorporating them within a vacuum insulated dewar flask, is shown in U.S. Pat. No. 4,375,157 (Boesen), and includes thermoelectric coolers that are powered from the surface and that transfer heat from within the dewar tube to the well fluid by means of a vapor phase heat transfer pipe. Such approaches are not suitable for use in drill strings since dewar flasks are not sufficiently robust to withstand the shock, vibration and high pressures to which the down hole assembly of a drill string is subjected. Moreover, the size of such configurations makes them difficult to package into a down hole assembly. Another approach, disclosed in U.S. Pat. No. 5,547,028 (Owens), involves placing a thermoelectric cooler adjacent an electronic component in a recess formed in the outer surface of a well logging tool. However, this approach does not ensure that there will be adequate contact between the components to ensure good heat transfer, nor is the electronic component protected from the shock and vibration that it would experience in a drilling application.

Consequently, it would be desirable to provide a rugged yet reliable system for effectively cooling the electronic components that is suitable for use in a well. It would also be desirable to provide a cooling system that was capable of being used in a downhole assembly of a drill string.

SUMMARY OF THE INVENTION

It is an object of the current invention to provide a rugged yet reliable system for effectively cooling the electronic components that is suitable for use in a well, and preferably, that is capable of being used in a downhole assembly of a drill string. This and other objects is accomplished in a cooled electrical system in which an electronic component is juxtaposed with one or more thermoelectric coolers that facilitate the transfer of heat from the component to the fluid in the well.

According to the current invention, a cooled electronic system for use in a well, such as downhole in a drill string through which a drilling fluid flows, comprises (i) a housing adapted to be disposed in a well and exposed to the fluid in the well, (ii) at least a first thermoelectric cooler, the first thermoelectric cooler comprising a hot plate on one side thereof, a cold plate on another side thereof, and means for transferring heat from the cold plate to the hot plate, (iii) a component that is in heat flow communication with the cold plate of the first thermoelectric cooler, whereby the cold plate receives heat from the electronic component and transfers the received heat to the hot plate, and (iv) an elastically deformable support for suspending the component and the thermoelectric cooler within the housing. In one embodiment of the invention, the elastically deformable support comprises a spring that generates a force biasing the component toward the thermoelectric cooler and that provides capability to absorb differential thermal expansion within the system.

In a preferred embodiment of the invention, the component is an electrical component and the electrical system further a metallic shell that encloses the electronic component and that is in heat transfer communication with its potting material, whereby heat generated by electronic subcomponent is transmitted through the potting material to the metallic shell. The spring force generated by the elastically deformable support acts against the shell, which acts as a crush resistant package.

BRIEF DESCRIPTION OF THE DRAWINGS

FIG. 7 is an exploded isometric view of the button assembly shown in FIGS. 5 and 6.

DESCRIPTION OF THE PREFERRED EMBODIMENTS

Figure 1:
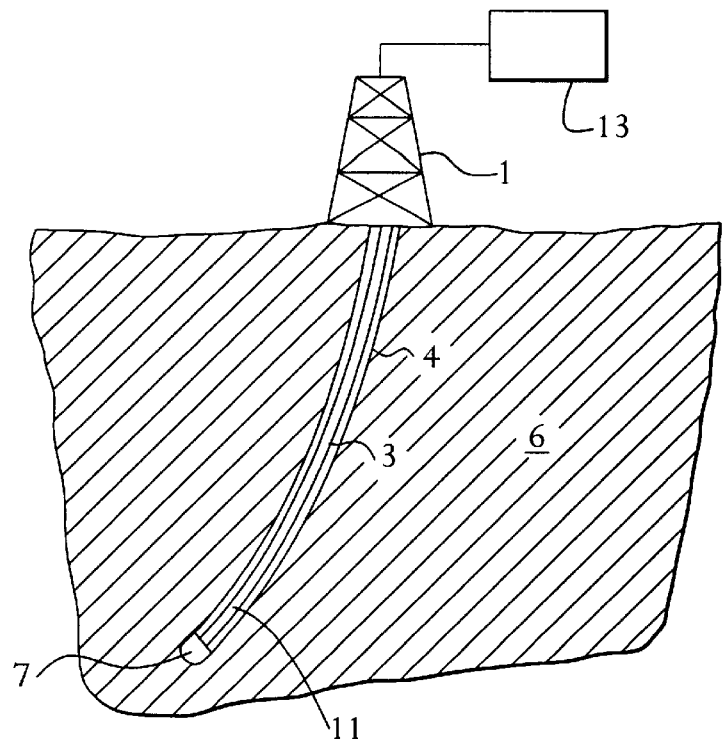
FIG. 1 is cross-section through a drill string according to the current invention in use forming a bore.
Figure 9:
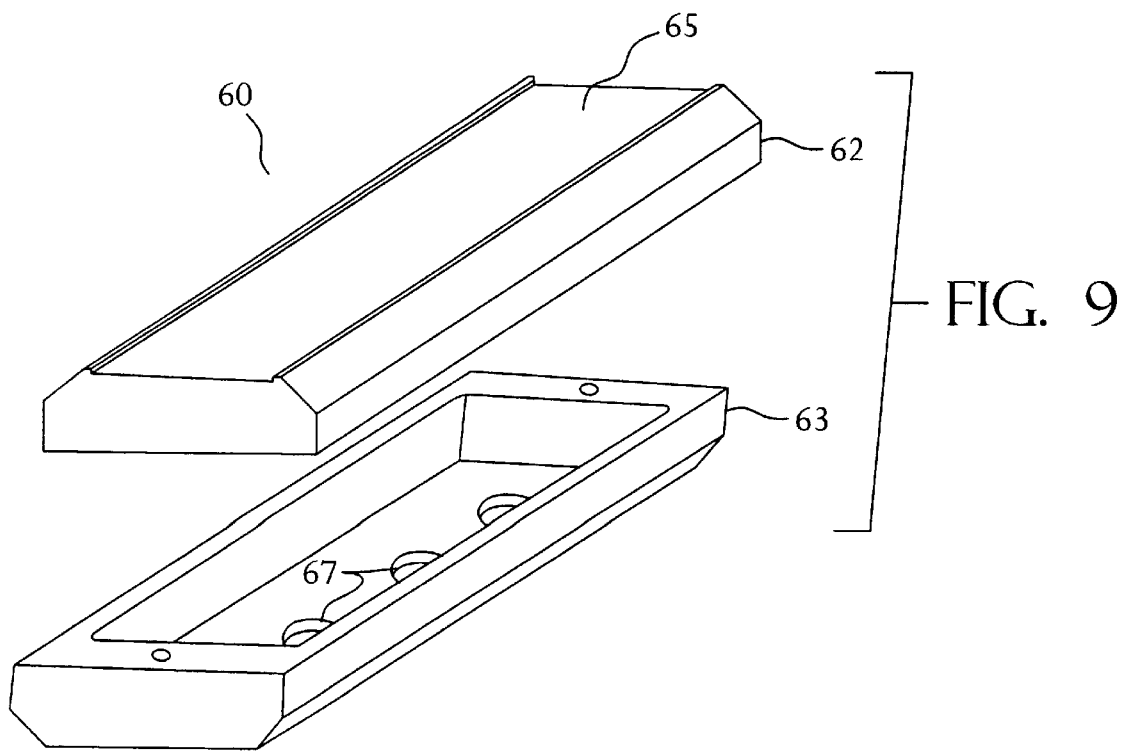
FIG. 9 is an isometric view of the shell shown in FIGS. 5 and 6.
Figure 2:
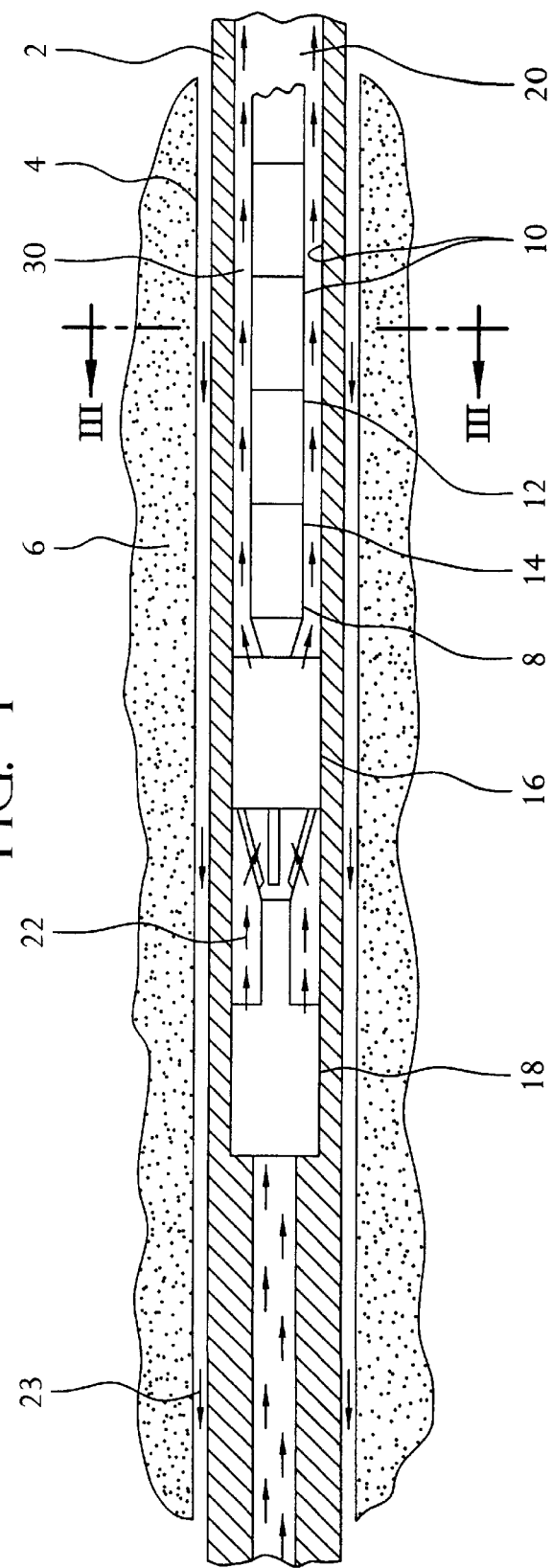
FIG. 2 is a longitudinal cross-section through a portion of the downhole assembly of the drill string shown in FIG. 1 incorporating an electrical system cooled according to the current invention.

A drilling operation according to the current invention is shown in FIG. 1. A drill rig 1 drives a drill string 3 that, as is conventional, is comprised of a number of interconnecting sections. A down hole assembly 11 is formed at the distal end of the drill string 3. The down hole assembly 11 includes a drill bit 7 that advances to form a bore 4 in the surrounding formation 6. A portion of the downhole assembly 11, incorporating an electronic system 8 according to the current invention, is shown in FIG. 2. The electrical system 8 may, for example, provide information to a data acquisition and analysis system 13 located at the surface. The electrical system 8 includes one or more electronic components. Such electronic components include those that incorporate transistors, integrated circuits, resistors, capacitors, and inductors, as well as electronic components such as sensing elements, including accelerometers, magnetometers, photomultiplier tubes, and strain gages.

The downhole portion 11 of the drill string 3 includes a drill pipe, or collar, 2 that extends through the bore 4. As is conventional, a centrally disposed passage 20 is formed within the drill pipe 2 and allows drilling mud 22 to be pumped from the surface down to the drill bit. After exiting the drill bit, the drilling mud 23 flows up through the annular passage formed between the outer surface of the drill pipe 2 and the internal diameter of the bore 4 for return to the surface. Thus, the drilling mud flows over both the inside and outside surfaces of the drill pipe. Depending on the drilling operation, the pressure of the drilling mud 22 flowing through the drill pipe internal passage 20 will typically be between 1,000 and 20,000 psi, and, during drilling, its flow rate and velocity will typically be in the 100 to 1500 GPM range and 5 to 150 fps range, respectively.

As also shown in FIG. 2, the electrical system 8 is disposed within the drill pipe central passage 20. The electrical system 8 includes a number of sensor modules 10, a control module 12, a power regulator module 14, a pulser module 18, and a turbine alternator 16 that are supported within the passage 20, for example, by struts extending between the modules and the drill pipe 2.

According to the current invention, power for the electrical system 8, including the electronic components and the thermoelectric coolers, discussed below, is supplied by the turbine alternator 16, which is driven by the drilling mud 22. The turbine alternator 16 may be of the axial, radial or mixed flow type. Alternatively, the alternator 16 could be driven by a positive displacement motor driven by the drilling mud 22, such as a Moineau-type motor. In other embodiments, power could be supplied by an energy storage device located downhole, such as a battery.

Figure 3:
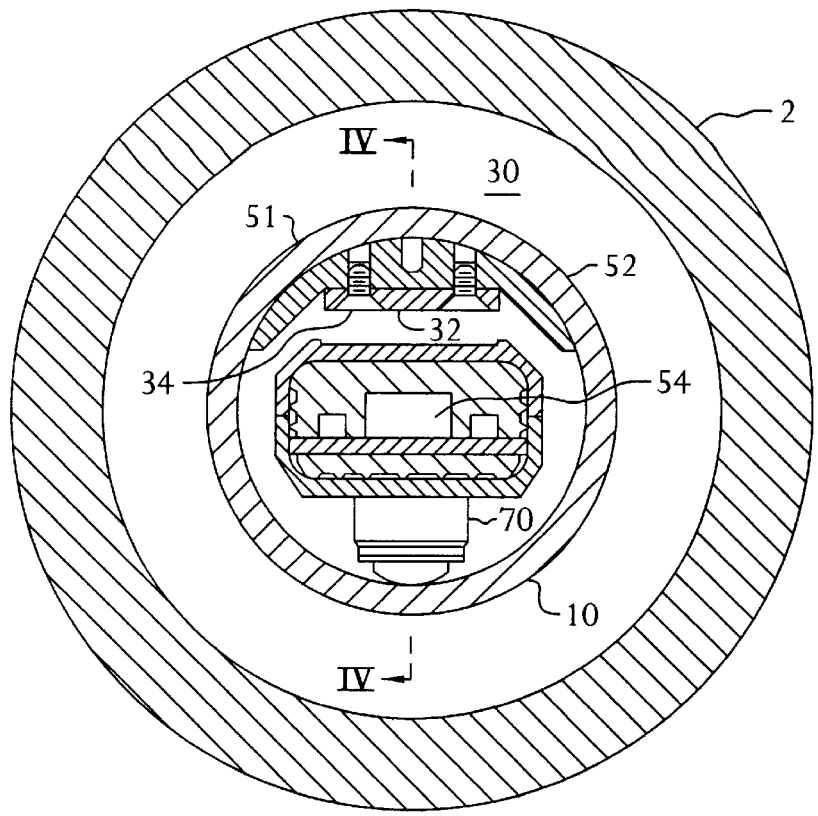
FIG. 3 is a transverse cross-section through one of the sensor modules shown in FIG. 2 taken along line III—III shown in FIGS. 2 and 4.

As shown in FIG. 3, each sensor module 10 is comprised of a cylindrical housing 52, which is preferably formed from stainless steel or a beryllium copper alloy. An annular passage 30 is formed between the outer surface 51 of the housing 52 and the inner surface of the drill pipe 2. The drilling mud 22 flows through the annular passage 30 on its way to the drill bit 7, as previously discussed. The housing 52 contains an electronic component 54 for the sensor module. The electronic component 54 may, but according to the invention does not necessarily, include one or more printed circuit boards associated with the sensing device, as previously discussed. Alternatively, the assembly shown in FIG. 3 could comprise the control module 12, power regulator module 14, or pulser module 18, in which case the electronic component 54 may be different than those used in the sensor modules 10, although it may, but again does not necessarily, include one or more printed circuit boards.

Figure 5:
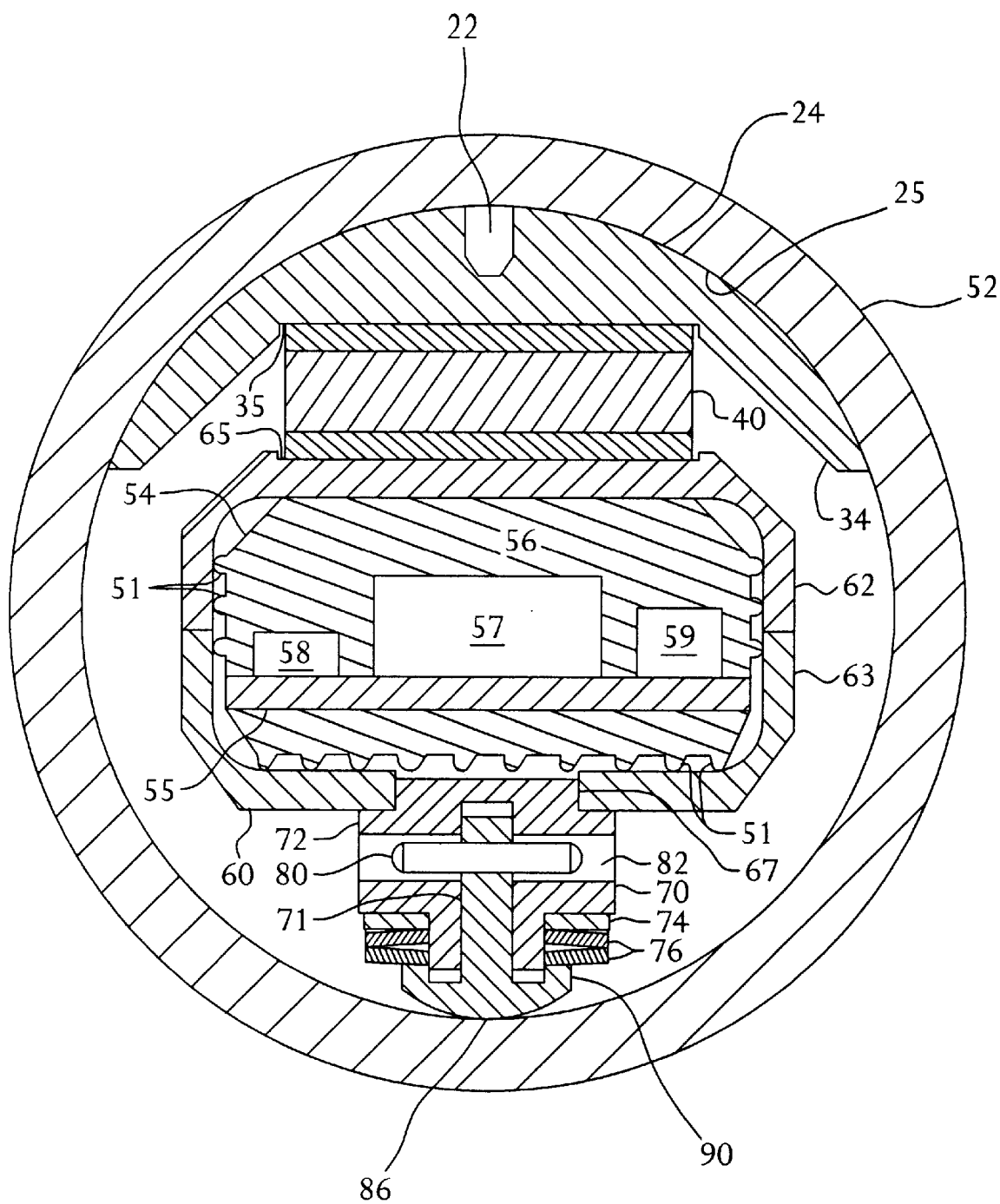
FIG. 5 is a transverse cross-section of the sensor module taken along line V—V shown in FIG. 4.
Figure 5A:
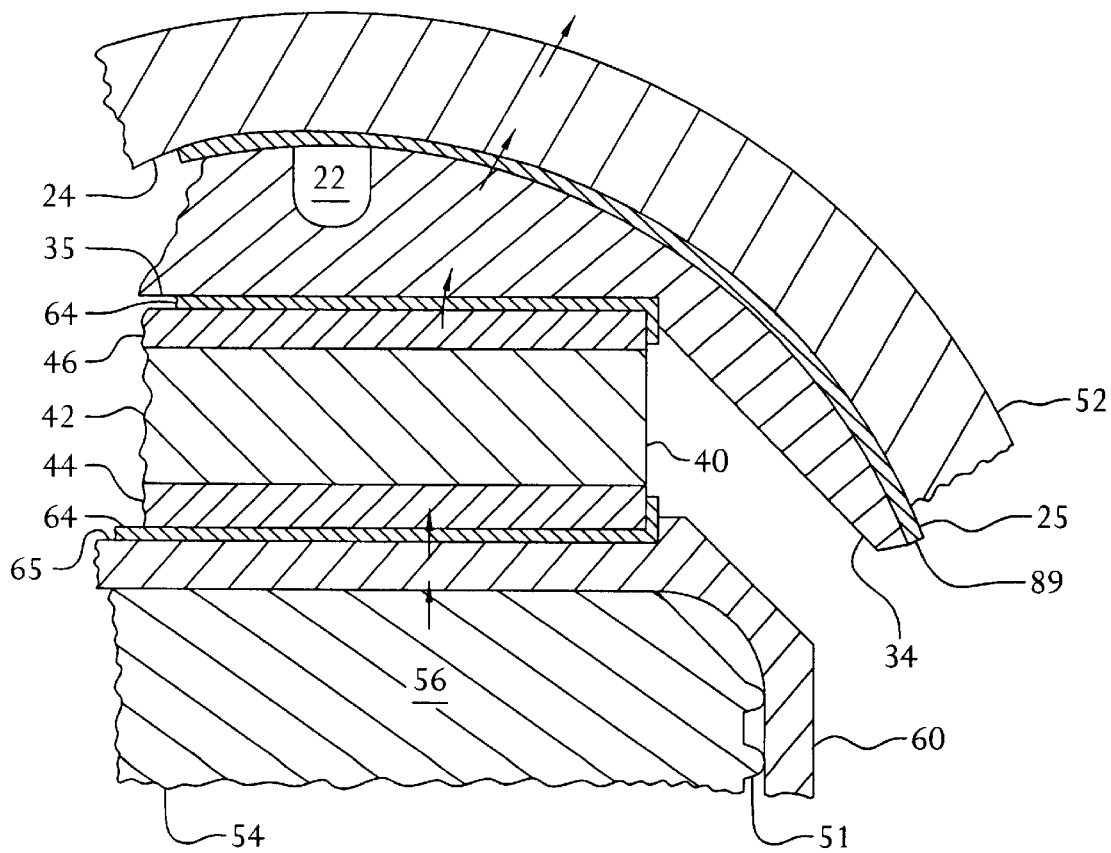
FIG. 5a is a detailed view of a portion of the sensor module shown in FIG. 5.

According to the current invention, one or more of the electronic components in the electrical system 8 are cooled by thermoelectric coolers. A thermoelectric cooler is a small, solid state heat pump that, conventionally, is semiconductor based. A detailed view of a simple thermoelectric cooler 40 is shown in FIG. 5a. In its simplest form, the device consists of a center portion 42 comprised of two different types of semiconductors, such as a p-type and an n-type, respectively, connected electrically in series and thermally in parallel. Typically, this assembly is sandwiched between plates 44 and 46, which are often made from a ceramic material. A DC power source provides energy to move electrons through the system. When a positive DC voltage from the power source is applied to the n-type semiconductor, electrons pass from the low energy p-type semiconductor to the high energy n-type semiconductor. In so doing, the electrons absorb energy (i.e., heat). As the electrons pass from the high energy n-type semiconductor to the low energy p-type semiconductor, heat is expelled. Thus, heat energy is initially transferred from a heat source to a cold junction, or cold plate, 44. This heat is then transferred by the semiconductors to a hot junction, or hot plate, 46. The heat transferred is a function of the current and proportional to the number of thermoelectric couples. From the hot plate 46, the heat is transferred to a heat sink. Thus, thermoelectric coolers essentially cause heat to flow from a lower temperature to a higher temperature, analogous to pumping a fluid from a lower elevation to a higher elevation.

The heat pumping ability of thermoelectric coolers typically ranges from a few milliwatts to hundreds of watts. A single stage thermoelectric cooler can achieve temperature differences between the hot and cold plates of 70° F. more, or can transfer heat at a rate of about 25 watts or more. Greater temperature differences, for example 130° F., and greater heat transfer rates are possible with a thermoelectric cooler employing a multistage or cascade arrangement in which the hot plate of one stage of thermoelectric cooler transfers heat to the cold plate of another stage of thermoelectric cooler. As used herein, the term "thermoelectric cooler" includes both a single stage thermoelectric cooler, as well as multistage and cascade arrangements of multiple thermoelectric cooler stages.

Semiconductors for thermoelectric coolers suitable for use in the current invention may be fabricated from an alloy of bismuth, telluride, selenium, and antimony. Preferably, they are doped and processed to yield oriented polycrystalline semiconductors with anisotropic thermoelectric properties. The plates 44 and 46 are preferably made from metallized beryllium oxide and/or aluminum oxide ceramics. Thermoelectric coolers are typically available in sizes ranging from ⅛ inch square and ¹⁄₁₀₀ inch thick to 2 inches square and ²⁄₁₀ inch thick. Temperature can be controlled to within 0.5° F.

The thermoelectric coolers are preferably supplied with DC power in the form of high quality current that is smooth and constant with very low ripple or noise. Preferably, pulse width modulation is used to convert the AC line voltage generated by the turbine alternator 16 to a lower DC signal, which is filtered, through control of the duty cycle and the power frequency applied to the thermoelectric coolers. Preferably, the frequency of the pulse width modulation is kept as low as possible to maintain a continuous output voltage.

Thermoelectric coolers have many advantages that make them suitable for use in a downhole assembly—they have solid state reliability, use no gas or refrigerants, are small and light weight, operate in any orientation, are resistant to shock and vibration, have no moving parts, generate no electrical noise, require no maintenance, are capable of precise temperature control, and have a long life. The current invention is directed to a configuration for a cooled electronic system in a downhole assembly that effectively utilizes thermoelectric coolers and that avoids the problems that previously rendered them unsuitable for use in a downhole environment.

According to the current invention, the electronic component is cooled by placing it in heat transfer communication with the fluid in the well, such as drilling mud in a drilling operation. As used herein, the term "heat flow communication" refers to the transfer of heat, for example, by conduction or convection, between two members, either directly, for example by surface contact, or indirectly through an intermediate member. As used herein, the term "direct conductive heat flow communication" refers to the transfer of heat by conduction between two members in contact with each other, without the aid of an intermediate member.

According to the current invention heat transfer from the electronic component to the drilling mud is accomplished by juxtaposing one or more thermoelectric coolers with the electronic component. The thermoelectric coolers are placed in conductive heat flow communication with the housing so that, ultimately, the thermoelectric cooler causes heat to flow from the electronic component to the drilling mud even though the drilling mud may be at a higher temperature than the electronic component.

FIGS. 3–9 show one embodiment of the cooled electronic system according to the current invention. As previously discussed, the electronic component 54 may comprise a printed circuit board 49. As is conventional, electronic elements, or sub-components, 57–59, for example, transistors, integrated circuits, resistors and capacitors, are mounted on the upper and/or low surfaces of a substrate 55, as shown best in FIG. 5.

As is conventional, the upper and lower surfaces of the printed circuit board 49 may be encapsulated in a potting material 56, which is preferably an elastomer or a resin, such as a silicon rubber, that provides a certain amount of damping, thereby protecting the sub-components against shock and vibration, and that is preferably thermally conductive. One such potting material is Stycast, available from Emerson Cuming of Lexington, MA. The potting material also imparts stiffness to the electronic component 54.

Alternatively, as is also conventional, on the upper surface of the printed circuit board may be encapsulated by the potting material, while the lower surface is mounted on a thermally conductive viscoelastic cushion. Suitable viscoelastic cushions include silicone rubber pads such as a Series 400 pad available from Furon Thermal Management, 407 East Street, New Haven, Conn. Wires or other electrical conductors (not shown) interconnect the electronic component 54 with other components within the electrical system 8. Although all of the sub-components for the sensor 10 are shown as being encapsulated into a single electronic component 54, the invention could also be practiced by employing a number of separate electronic components, each of which may be electrically interconnected.

According to an important aspect of the current invention, the electronic component 54 is enclosed by a shell 60, formed by upper and lower halves 62 and 63, respectively. The shell serves at least two important functions. First, it efficiently collects and transmits heat from the surface of the electronic component 54 to the thermoelectric coolers 40. Second, it provides a crush resistant package that allows large forces—which may be too large for the electronic component 40 (e.g., the potting material 56) to withstand—to be utilized to bias the electronic component and thermoelectric coolers 40, as well as a thermal conductor, into surface contact, as discussed in detail below. Accordingly, the shell 60 is preferably made from a rigid, thermally conductive material. As used herein, the term "thermally conductive material" refers to materials having a coefficient of thermal conductivity, k, of at least 0.1 BTU/hr-ft-° F. More preferably, the shell 60 is made from a material having a coefficient of thermal conductivity that is at least about 1.0 BTU/hr-ft-° F. and, still more preferably, that is at least about 20 BTU/hr-ft-° F. Most preferably, the shell 60 is made of metal, such as aluminum, which has a coefficient of thermal conductivity of over 90 BTU/hr-ft-° F.

Figure 6:
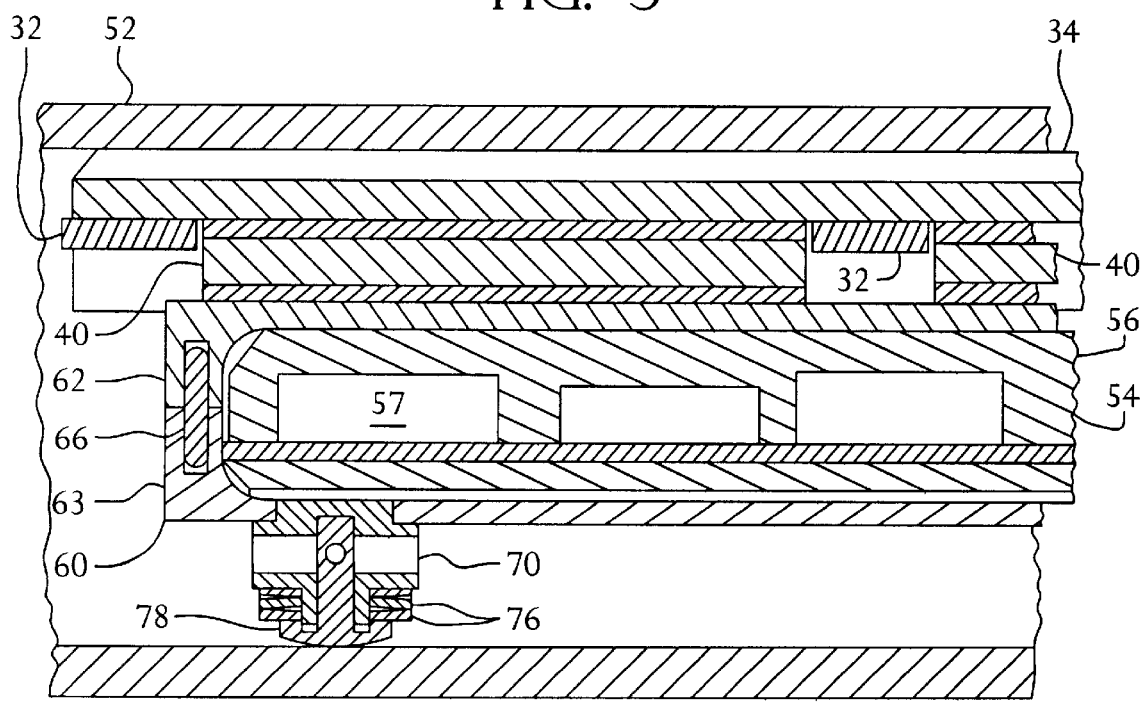
FIG. 6 is a detailed view of a portion of the sensor module shown in FIG. 4.

As shown in FIG. 6, guide pins 66 installed in mating holes in the upper and lower halves 62 and 63 of the shell 60 maintain the two halves in alignment but otherwise do not restrict the travel of the upper and lower housing halves in the vertical direction, so that the housing halves can be separated. Openings formed in the lower half 63 of the shell 60 engages support members 70, discussed in detail below.

The shell 60 is dimensioned so that its inner surfaces are in contact with the potting material 56. Since potting materials typically have a relatively high coefficient of thermal expansion that is greater than that of the metal shell 60, longitudinally extending ridges 51 are formed in the portion of the potting material 56 that forms the sides and bottom of the electronic component 54. The potting material 56 is sufficiently elastically so that differential thermal expansion between the potting material and the shell 60 is absorbed by deformation of the ridges 51, thereby avoiding placing excessive forces on the shell that would otherwise tend to separate its upper and lower halves 62 and 63. Deformation of the rides 51 tends to improve the surface contact between the shell 60 and the potting material 56. Alternatively, voids could be formed within the potting material 56 that collapsed under compressive loading so as to absorb the differential thermal expansion.

Members other than potting material, such as springs, can also be utilized to provide a thermal path between the electronic sub-components 57–59 and the shell 60.

As discussed below, a thermoelectric cooler 40 contacts the upper surface of the shell 60 and an elastically deformable support 70, preferably having relatively low thermal conductivity, contacts the lower surface of the shell. Except for these portions, the surfaces of the shell 60 are surrounded by air, which acts as an insulator that prevents the transfer of heat from the housing to the electronic component 54. Alternatively, the air space could be evacuated or filled with insulating material, such as a foam, or radiation baffles could be installed, to further retard heat transfer from the housing to the electronic component 54.

Figure 8:
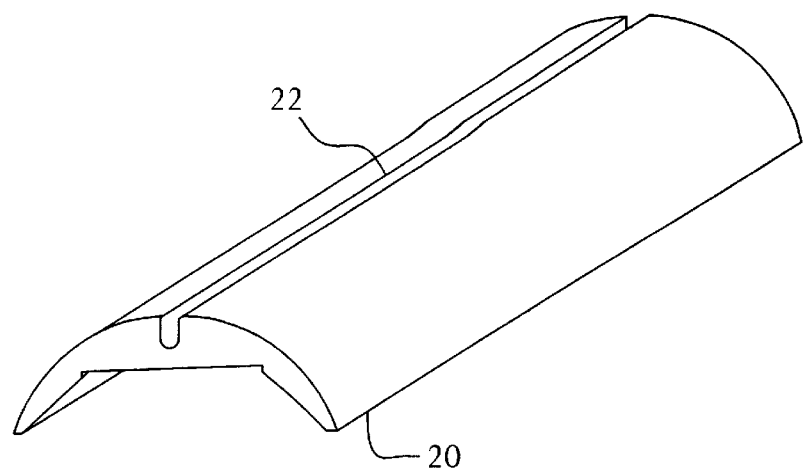
FIG. 8 is an isometric view of the thermal conductor shown in FIGS. 5 and 6.

A thermal conductor strip 34, shown best in FIG. 8, is preferably disposed adjacent the inner surface 24 of the housing 52. As used herein, the term "thermal conductor" refers to a member made substantially from thermally conductive materials. Thus, like the shell 60, the thermal conductor strip 34 is formed from a thermally conductive material and, more preferably, is formed from a material having a coefficient of thermal conductivity that is at least about 1.0 BTU/hr-ft-° F. and, still more preferably, is at least about 20 BTU/hr-ft-° F. Most preferably, the thermal conductor strip 34 is also made of aluminum. A groove 22 is formed in the outer surface 25 of the thermal conductor strip 34 and provides a passage for electrical conduits (not shown), such as those used to power the thermoelectric coolers. A restraining device, such as spring biased pin (not shown) extending between the thermal conductor strip 34 and the housing 52 may be employed to prevent rotation of the thermal conductor within the housing and to restrain relative motion in the axial direction.

The outer surface 25 of the thermal conductor strip 34 is preferably in surface contact with the inner surface 24 of the housing 52. Such surface contact enhances conductive heat transfer from the thermal conductor strip 34 to the housing 52. Practically speaking, perfect surface contact, on a microscopic level, between two surfaces is not possible. Therefore, as used herein, the term "surface contact" refers to contact in which a substantial portion of the respective heat transfer surfaces of two members are in contact, as distinguished from line or point contact, which is confined to very localized areas.

Good surface contact can be achieved by accurately machining the outer surface 25 of the thermal conductor strip 34 so that it has the same radius of curvature as the inner surface 24 of the housing 52. As shown in FIG. 5a, good surface contact between thermal conductor strip 34 and the housing 52 can be further aided by incorporating a conformable thermal interface material 89 into the thermal conductor strip 34 so that the thermal interface material forms the surface 25 of the thermal conductor strip that contacts the housing inner surface. Alternatively, the conformable thermal interface material 89 could be incorporated into the housing 52 so as to form its inner surface 24. The conformable thermal interface material 89 comprises a material layer that is sufficiently deformable under compression to conform to the surface profiles of both the outer surface 25 of the thermal conductor strip 34 and the inner surface 24 of the housing 52 so as to ensure good surface contact, thereby maximizing thermal conduction. Preferably, the thermal interface material 89 is also a thermally conductive material.

Incorporation of the conformable thermal interface material into the thermal conductor strip 34 or the housing 52 aids in creating surface contact between these two members and, therefore, direct conductive heat flow communication between the outer surface 24 of the thermal conductor strip and the housing inner surface 25—that is, the placement of a thermal interface material between two members does not prevent but, in fact, facilitates placing the two members in direct conductive heat flow communication as that term is used herein. Suitable thermally conductive, conformable thermal interface materials 89 include those incorporating a 2 mil thick acrylic pressure sensitive transfer adhesive, such as a TR 42 thermal adhesive material, also available from Furon Thermal Management. A Kapton™ film coated on both sides with a thermally conductive pressure sensitive adhesive, also available from Furon Thermal Management, could also be used to provide further conformability. As will be readily appreciated by those skilled in the art, a variety of other thermally conductive, thermal interface materials could also be utilized, including thermal graphite tape, thermal aluminum tape, silicone rubber coated tape, thermal grease, such as a silicone based grease, and thermal phase change material, such as Furon DuraForm C950, available from Furon Thermal Management.

According to the current invention, the thermoelectric cooler 40 is disposed between the shell 60 and the thermal conductor strip 34 so that its cold plate 44 is in surface contact with the upper surface 65 of the shell and its hot plate 46 is in surface contact with the inner surface 35 of the thermal conductor strip, as shown best in FIG. 5a. Good surface contact can be ensured by incorporating a thermal interface material 64, which may be similar to the thermal interface material 89 discussed above, into the upper surface 65 of the shell 60 and into the inner surface 35 of the thermal conductor strip 34. If the cold and hot plates 44 and 46 of the thermal conductor 40 are not already insulated, the thermal interface material 64 should also be an electrical insulator. Alternatively, or in addition, the surfaces 35 and 65 of the thermal conductor strip 34 and shell 60 can be anodized so as to form a layer of aluminum oxide, which has good thermal conductivity but poor electrical conductivity.

Figure 4:
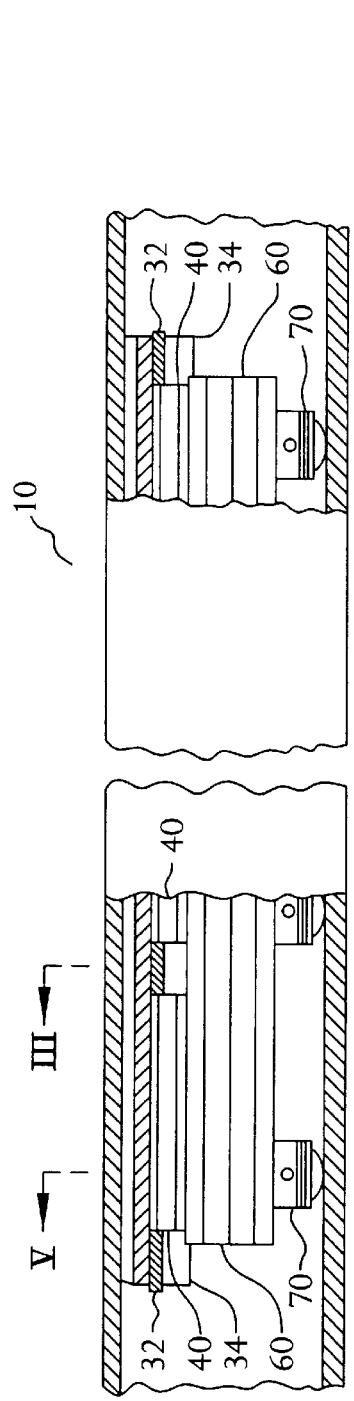
FIG. 4 is a longitudinal cross-section through the sensor module taken along line IV—IV shown in FIG. 3.

If the electronic component 54 is relatively long, or if an array of separate electrical components are utilized within a single housing 52, an axial array of a number of thermoelectric coolers 40 can be utilized as shown in FIGS. 4 and 6. As shown in FIG. 5, spacers 32 are attached to the inside surface of the thermal conductor 34 using screws 34. As shown best in FIG. 6, the spacers 32 restrain the thermoelectric coolers 40 in the axial direction and separate adjacent thermoelectric coolers.

As indicated by the arrows in FIG. 5a, in operation, heat generated by the electronic sub-components 57–59 is transferred by conduction to the potting material 56. The heat is then transferred by conduction from the potting material 56 to the inner surfaces of the shell 60. From the upper surface 65 of the shell 60, the heat is transferred to the cold plate 44 of the thermoelectric cooler 40. The heat transfer coefficient of the shell 60 is higher than that of typical potting materials, which generally have a coefficient of thermal conductivity between about 0.1 and 1.0 BTU/hr-ft-° F. Thus, the shell 60 serves to efficiently transfer heat from the surfaces of the electronic component to the thermoelectric cooler 40. As previously discussed, the thermoelectric cooler 40 transfers heat from the cold plate 44 to the higher temperature hot plate 46. The hot plate 46 then transfers the heat to the inner surface of the thermal conductor strip 34 by conduction, which then transfers the heat to the inner surface 24 of the housing 52, also by conduction. In this regard, the heat transfer surface area 25 of the thermal conductor strip 34 is preferably greater than that of the hot plate 26, as shown best in FIG. 5, so as to efficiently enable the rapid transfer of heat from the thermoelectric cooler 40 to the housing 52. The housing 52 then transfers the heat by convection to the fluid 22 flowing through the drill pipe 2. In the event that the fluid 22 is not flowing, for example, because drilling has ceased, the housing 52 can still transfer sufficient heat to the fluid surrounding the housing to effect cooling of the electronic component 54.

According to an important aspect of the current invention, the shell 60 is supported on elastically deformable supports 70, shown best in FIG. 7. Depending on the length of the shell 60, a number of elastically deformable supports 70 may be spaced along the length of the shell, as shown in FIG. 4. Each elastically deformable support 70 comprises a sleeve 72, a button 78, a pair of springs 76, and a flat washer 74. The sleeve 72 has upper and lower shoulders 73 and 75, respectively. A first hole 71 is formed in the sleeve so as to extend upwardly through a portion of the sleeve, while a second hole 82 extends transversely through the sleeve. The button 78 has a shaft portion 88 and an enlarged head portion 90. The shaft 88 slides within the hole 71 and is retained within the sleeve 72 by a pin 80. The pin 80 extends through a hole 84 in the shaft 88 and is disposed within the transverse hole 82 in the sleeve. A pair of opposing belleville springs 76 are mounted on the lower portion of the sleeve 72 and are retained between the flat washer 74 and the button head portion 90. Although belleville springs 76 are shown, other types of springs, such as helical compression springs or leaf springs, could also be utilized.

The cooled electrical system can be installed into the housing 52 in a variety of ways. Preferably, the lower half 63 of the shell 60 is mounted on the support 70 by inserting the upper portion 77 of the sleeve 72 into the hole 67 formed in the lower shell half 63. The electronic component 54 is mounted in the lower shell half 63 and the upper shell half 62 is placed on top of the lower half, using the guide pins 66. The thermoelectric cooler 40 is then mounted on the upper surface 65 of the shell 60 and the thermal conductor 34 is mounted on the thermoelectric cooler. This assembly is then inserted into the bore in the housing 52.

Regardless of the assembly procedure, of importance is the fact that the support 70 is dimensioned so that when the thermal conductor 34, thermoelectric cooler 40 and shell 40 are assembled into the housing 52, the inner surface of the housing 52 presses the head 90 of the button 78 against the belleville springs 76, causing them to compress. This causes the upper shoulder 73 of the sleeve 72 to press upward against the lower surface of the low half 63 of the shell 60. The upper surface 65 of the shell 60 is, in turn, pressed against the cold plate 44 of the thermoelectric cooler 40. The hot plate 46 of the thermoelectric cooler 40 is, in turn, pressed against the inner surface 35 of the thermal conductor strip 34, while the outer surface 25 of the thermal conductor strip 34 is pressed against the inner surface 24 of the housing 52.

Thus, the elastically deformable support 70 performs several important functions. First, it biases the other components so as to ensure that they contact each other and urges the assembly toward the inner surface 24 of the housing 52. This ensures good conductive heat transfer at each interface from the electronic component 54 to the housing 52.

Second, it suspends the components within the housing so as to provide a mechanism to absorb differential thermal expansion between the components and the housing 52. Preferably, the diameter of the support pin 80 relative to that of the hole 82 in the sleeve 72, and the location of the hole 84 in the button shaft 78, are such that, upon assembly at room temperature, there is clearance between the pin 80 and the sides of the hole 82. This clearance is sufficiently great so that during operation, differential thermal expansion between the components and the housing is absorbed by deflection of the belleville springs 76, without causing the pin 80 to contact the surfaces of the hole 82. Thus, the button 78 will always float within the support sleeve 72.

Depending on the temperature gradients and the materials utilized, the components of the electrical system may grow more than the housing 52. Were it not for the elastically deformable support 70, this situation could result in potentially destructively high compressive forces being imposed on the components. According to the current invention, this is prevented by the elastically deformable support 70, which absorbs growth of the components by further compression of the belleville springs. Alternatively, the temperature gradients and the materials utilized could result in the housing growing more than the components. Were it not for the elastically deformable support 70, this situation could result in loss of surface contact among the components and, therefore, inadequate heat transfer. According to the current invention, the elastically deformable support 70 prevents this occurrence by only partially relieving the initial precompression of the belleville springs so that sufficient spring force remains to ensure good surface contact.

Third, the elastic deformation of the belleville springs 76 provides additional capability, beyond that associated with the potting material 56, to absorb shock and vibration that might otherwise damage the components.

Preferably, the sleeve 72 is made from a high temperature, high strength plastic with relatively low thermal conductivity, such as Torlon™, available from Amoco of Chicago, Ill. The button 78 is preferably made from a metal for maximum hardness but one that has relatively low thermal conductivity, such as stainless steel. Preferably, the distal end 86 of the button 78 is conical so that only a relatively small surface contacts that inner surface 24 of the housing 52 at location 86, thereby minimizing the heat conduction path from the housing to the button. The Belleville springs 76 are preferably made of stainless steel. The flat washer 74 is preferably metallic and provides a bearing surface for the upper belleville spring 76 that protects the lower shoulder 75 of the sleeve 72.

Figure 10:
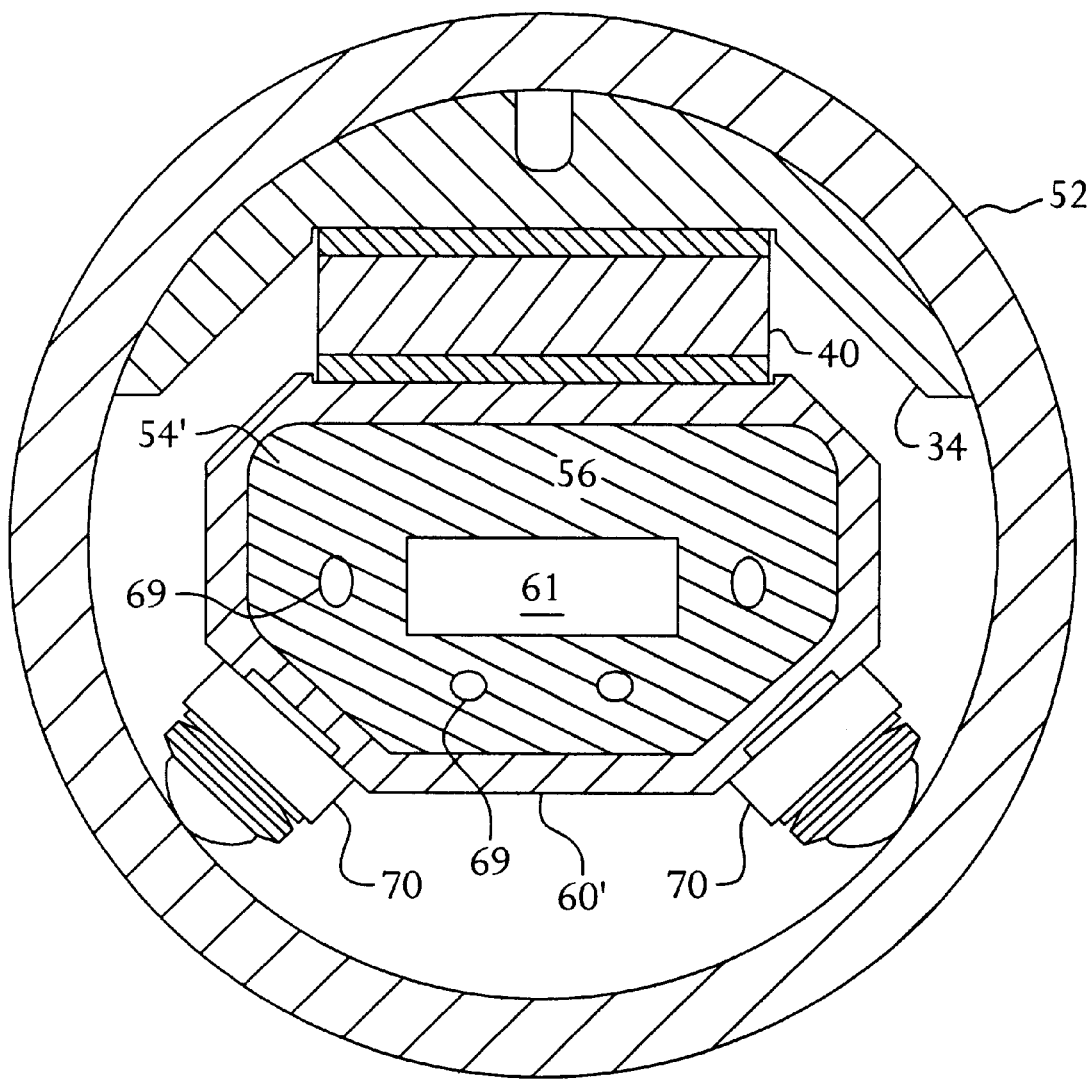
FIG. 10 is a view similar to FIG. 5 showing an alternate embodiment of the invention.

FIG. 10 shows another embodiment of the invention, in which elastically deformable supports 70 are disposed at 120° and 240°. This allows the elastically deformable supports 70 to impart both cooperating vertical forces and opposing horizontal forces to the shell 60. This arrangement not only biases the components of the electrical system into surface contact with each other, and presses the thermal conductor 34 into surface contact with the inner surface of the housing 52, as before, it provides additional stability in the transverse direction that ensures that the electronic component remains centered withing the housing. Further, in this embodiment, the electronic component 54' is a sensor, such as a magnetometer 61 encapsulated in potting material 56 in which voids 69 are formed to absorb differential thermal expansion between the housing 52 and the potting material.

As can be appreciated, the various embodiments of the current invention provide highly effective configurations for cooling an electrical system in a downhole assembly that incorporates thermoelectric coolers yet is compact and durable and sufficiently rugged to withstand the shock and vibration to which downhole assemblies are subjected. In addition, the configurations afford high rates of conductive heat transfer so as to maximize the usefulness of the thermoelectric coolers.

Although the invention has been illustrated by incorporating an electrical component inside the interior of a housing located within a drill pipe, the invention could also be practiced by incorporating the arrangement discussed above in a recess formed in the outer surface of the drill pipe, or in another member having a surface exposed to the drilling mud. Further, although the current invention has been illustrated in connection with an electrical system in a downhole assembly the principles of the invention could also be utilized in other portions of a drill string requiring the cooling of electronic components or in other devices employing electronic components within a well, such as devices for logging existing wells. The invention is also applicable to cooling components other than electrical components. Accordingly, the present invention may be embodied in other specific forms without departing from the spirit or essential attributes thereof and, accordingly, reference should be made to the appended claims, rather than to the foregoing specification, as indicating the scope of the invention.

What is claimed:

1. A cooled electronic system for use downhole in a drill string through which a drilling fluid flows, the cooled electronic system comprising:
   a) a housing adapted to be disposed within said drill string, whereby said drilling fluid flows over said housing;
   b) at least a first thermoelectric cooler, said first thermoelectric cooler comprising (i) a hot plate on one side thereof, (ii) a cold plate on another side thereof, and (iii) means for transferring heat from said cold plate to said hot plate;
   c) a component for use in said electrical system, said component being in heat flow communication with said cold plate of said first thermoelectric cooler, whereby said cold plate receives heat from said electronic component and transfers said received heat to said hot plate; and
   d) an elastically deformable support for suspending said electronic component and said thermoelectric cooler within said housing.

2. The cooled electrical system according to claim 1, wherein said component is an electronic component comprising at least one electronic sub-component encapsulated by a potting material, and further comprising a metallic shell enclosing said at least a portion of electronic component and in heat transfer communication with said potting material, whereby heat generated by said electronic sub-component is transmitted through said potting material to said metallic shell.

3. The cooled electrical system according to claim 2, wherein said metallic shell is in surface contact with said potting material.

4. The cooled electrical system according to claim 2, wherein said metallic shell is in heat flow communication with said thermoelectric cooler, whereby said heat transmitted to said shell by said potting material is subsequently transmitted to said thermoelectric cooler.

5. The cooled electrical system according to claim 4, wherein said elastically deformable support comprises a spring, said spring generating a force biasing said metallic shell toward said thermoelectric cooler.

6. The cooled electrical system according to claim 4, further comprising a thermal conductor disposed between said thermoelectric cooler and said inner surface of said housing, whereby heat transmitted to said thermoelectric cooler is subsequently transmitted to said housing by said thermal conductor.

7. The cooled electrical system according to claim 6, wherein said spring is located so that said spring force biases said thermoelectric cooler toward said thermal conductor.

8. The cooled electrical system according to claim 7, wherein said housing has an inner surface, and wherein said spring is located so that said spring force also biases said thermal conductor toward a first portion of said housing inner surface.

9. The cooled electrical system according to claim 8, wherein said housing forms a portion of a drill pipe forming said drill string, whereby said fluid flows over an inner surface of said housing.

10. The cooled electrical system according to claim 8, wherein said housing forms a portion of a sensor module enclosed by a drill pipe, whereby said fluid flows over an outer surface of said housing.

11. The cooled electrical system according to claim 2, wherein said housing has an inner surface, and wherein said elastically deformable support comprises a spring, said spring generating a force biasing said metallic shell and said thermoelectric cooler toward a first portion of said housing inner surface.

12. A cooled electronic system for use in a well containing a fluid, said cooled electronic system comprising:
   a) a housing having first and second surfaces and adapted to be disposed within said well, whereby said first surface of said housing is exposed to said fluid and is in convective heat transfer therewith;
   b) at least a first thermoelectric cooler, said first thermoelectric cooler comprising (i) a hot plate on one side thereof, (ii) a cold plate on another side thereof, and (iii) means for transferring heat from said cold plate to said hot plate;
   c) an electronic component, said electronic component being in heat flow communication with said cold plate of said first thermoelectric cooler, whereby said cold plate receives heat from said electronic component and transfers said received heat to said hot plate;

d) an elastically deformable support for supporting said electronic component and said thermoelectric cooler within said housing, said elastically deformable support having means for generating an elastic force biasing said electronic component and said thermoelectric cooler toward a first portion of said housing inner surface.

13. The cooled electrical system according to claim 12, wherein said electronic component is at least partially enclosed by a crush resistant shell, and wherein said force generated by said spring acts upon said shell, whereby said shell transmits said spring force to said thermoelectric cooler.

14. The cooled electrical system according to claim 13, wherein said elastically deformable support further comprises a sleeve and a button slidably mounted within said sleeve so that said spring urges said button outwardly.

15. The cooled electrical system according to claim 14, wherein said shell is mounted on said sleeve.

16. The cooled electrical system according to claim 15, wherein said button contacts a second portion of said housing inner surface.

17. The cooled electrical system according to claim 12, wherein said electronic component is disposed between said thermoelectric cooler and said elastically deformable support.

18. A cooled electronic system for use in a well containing a fluid, said cooled electronic system comprising:

a) a housing having first and second surfaces and adapted to be disposed within said well, whereby said first surface of said housing is exposed to said fluid and is in convective heat transfer therewith;

b) a thermoelectric cooler, said thermoelectric cooler comprising (i) a hot plate on one side thereof, (ii) a cold plate on another side thereof, and (iii) means for transferring heat from said cold plate to said hot plate;

c) an electronic component;

d) conductive heat flow means for placing said cold plate of said thermoelectric cooler in conductive heat flow communication with said electronic component and said hot plate of said thermoelectric cooler in conductive heat flow communication with said second surface of said housing, whereby said cold plate receives heat from said electronic component by conduction and transfers said received heat to said hot plate, said hot plate transfers heat by conduction to said second surface of said housing, said housing transfers heat to said first surface thereof by conduction and then to said fluid by convection; and e) said conductive heat flow means comprising an elastically deformable member biasing said electronic component toward said thermoelectric cooler and biasing said thermoelectric cooler toward said housing second surface.

19. The cooled electrical system according to claim 18, further comprising a thermal conductor disposed between said hot plate of said thermoelectric cooler and said second surface of said housing, said elastically deformable member biasing said thermoelectric conductor toward said housing second surface.

20. The cooled electrical system according to claim 18, further comprising a shell at least partially enclosing said electronic component, said shell being made from a thermally conductive material, whereby shell transfers heat from said electronic component to said cold plate of said thermoelectric cooler.

21. The cooled electrical system according to claim 20, wherein said electronic component comprises at least one electronic sub-component encapsulated by a potting material, said shell being in heat flow communication with said potting material, whereby heat generated by said electronic sub-component is transmitted through said potting material to said shell.

22. The cooled electrical system according to claim 20, wherein said elastically deformable member comprises a spring, said spring generating a force acting on said shell.

23. A cooled electronic system for use downhole in a drill string through which a drilling fluid flows, said cooled electronic system comprising:

a) a housing adapted to be disposed within said drill string, whereby said drilling fluid flows over said housing;

b) at least a first thermoelectric cooler, said first thermoelectric cooler comprising (i) a hot plate on one side thereof, (ii) a cold plate on another side thereof, and (iii) means for transferring heat from said cold plate to said hot plate;

c) an electronic component disposed within said housing, said electronic component having at least a first surface, said first surface of said first electronic component being in heat flow communication with said cold plate of said first thermoelectric cooler, whereby said cold plate receives heat from said first electronic component and transfers said received heat to said hot plate;

d) means for compensating for differential thermal expansion between said electronic component and said housing, said compensating means comprising an elastically deformable member disposed between said electronic component and a surface of said housing.

24. The cooled electrical system according to claim 23, wherein said elastically deformable member comprises a spring.

25. An apparatus for use down hole in a well, comprising:

a) a housing adapted to be disposed within said well so as to be exposed to fluid in said well;

b) a thermoelectric cooler disposed within said housing, said thermoelectric cooler comprising (i) a hot plate on one side thereof, (ii) a cold plate on another side thereof, and (iii) means for transferring heat from said cold plate to said hot plate;

c) a cooled component disposed within said housing, said component having at least a first surface, said first surface of said component being in heat flow communication with said cold plate of said thermoelectric cooler, whereby said cold plate receives heat from said component and transfers said received heat to said hot plate; and d) a shock absorber disposed within said housing, said component and said thermoelectric cooler mounted on said shock absorber, said shock absorber comprising an elastically deformable member disposed between said component and said housing.

* * * * *